(12) United States Patent
Weiss

(10) Patent No.: US 6,454,512 B1
(45) Date of Patent: Sep. 24, 2002

(54) PERSON-GUIDED VEHICLE (75) Inventor: Mitchell Weiss, Carlisle, MA (US)

(73) Assignee: PRI Automation, Inc., Billerica, MA (US)

( * ) Notice: Subject to any disclaimer, the term of this patent is extended or adjusted under 35 U.S.C. 154(b) by 0 days.

(21) Appl. No.: 09/527,537

(22) Filed: Mar. 16, 2000

Related U.S. Application Data
(60) Provisional application No. 60/125,023, filed on Mar. 18, 1999.

(51) Int. Cl.[7] .............................................. B65G 47/90
(52) U.S. Cl. ........................ 414/663; 414/401; 414/584; 414/495; 414/940; 414/217; 414/939; 414/539; 414/541; 118/500; 254/2 R; 187/233
(58) Field of Search ................................ 414/495, 939, 414/663, 662, 542, 660, 589, 541, 549, 539, 401, 584, 396, 217, 217.1, 940; 254/2 R; 16/44; 187/233; 118/500

(56) References Cited

U.S. PATENT DOCUMENTS

| | | |
|---|---|---|
| 3,067,884 A * | 12/1962 | Williams ................. 414/589 X |
| 3,735,886 A | 5/1973 | Stumpf |
| 4,515,235 A * | 5/1985 | Yamamoto et al. ......... 180/168 |
| 4,682,927 A | 7/1987 | Southworth et al. |
| 4,746,256 A | 5/1988 | Boyle et al. |
| 4,880,348 A | 11/1989 | Baker et al. ................. 414/783 |
| 4,895,486 A | 1/1990 | Baker et al. |
| 4,917,556 A | 4/1990 | Stark et al. |
| 5,271,702 A | 12/1993 | Dobbs et al. |
| 5,363,867 A | 11/1994 | Kawano et al. ............. 134/95.2 |
| 5,411,358 A | 5/1995 | Garric et al. ................ 414/277 |
| 5,431,600 A | 7/1995 | Murata et al. ............... 454/187 |
| 5,507,614 A | 4/1996 | Leonov et al. .............. 414/768 |
| 5,513,939 A * | 5/1996 | Martin et al. ........... 414/460 X |
| 5,570,990 A | 11/1996 | Bonora et al. .............. 414/543 |
| 5,590,735 A * | 1/1997 | Cartier .................... 414/608 X |
| 5,651,823 A | 7/1997 | Parodi et al. ................ 118/500 |
| 5,653,351 A * | 8/1997 | Grout et al. ............. 414/460 X |
| 5,655,869 A | 8/1997 | Scheler et al. .............. 414/222 |
| 5,660,517 A | 8/1997 | Thompson et al. |
| 5,731,678 A | 3/1998 | Zila et al. .............. 318/568.11 |
| 5,765,444 A | 6/1998 | Bacchi et al. ............ 74/490.03 |
| 5,836,736 A | 11/1998 | Thompson et al. ......... 414/786 |
| 5,839,874 A * | 11/1998 | Johnston ................. 414/460 X |
| 6,033,175 A | 3/2000 | Pflueger et al. ............. 414/401 |
| 6,102,647 A * | 8/2000 | Yap ............................ 414/539 |

FOREIGN PATENT DOCUMENTS

TW 263053 11/1995

OTHER PUBLICATIONS

*Operational Considerations for PGVs in 300mm Wafer Fabs*, John Pflueger, Ph.D. et al., SEMICON Korea Technical Symposium 98, pp. 23–30.

* cited by examiner

Primary Examiner—Frank E. Werner
(74) Attorney, Agent, or Firm—Weingarten, Schurgin, Gagnebin & Lebovici LLP

(57) ABSTRACT

A person-guided vehicle (PGV) is provided for transporting and manipulating at least one carrier containing items such as semiconductor wafers to be loaded or unloaded at a load port. The PGV includes a wheeled cart having a frame configured to align with the load port. A carrier support assembly is mounted to the frame. The carrier support assembly includes a cradle configured to support the carrier, a lifting mechanism operative to raise and lower the cradle vertically, and a horizontal slide mechanism operative to move the cradle horizontally to and from a position outboard of the cart. A damping system is coupled to the cart and operative to dampen vibrations of the carrier in the carrier support assembly. One side of the cart is free of structural members to allow operator access to the carrier support assembly and to allow ready manipulation of the cart by the operator.

17 Claims, 12 Drawing Sheets

PERSON-GUIDED VEHICLE

CROSS REFERENCE TO RELATED APPLICATIONS

Applicant claims priority under 35 U.S.C. §119(e) of U.S. Provisional Application No. 60/125,023, filed Mar. 18, 1999, the disclosure of which is incorporated by reference herein.

STATEMENT REGARDING FEDERALLY SPONSORED RESEARCH OR DEVELOPMENT

N/A

BACKGROUND OF THE INVENTION

In semiconductor wafer manufacturing, wafer substrates are often transported in wafer carriers. The industry has been migrating to the use of 300 mm wafers. When fully loaded, a 300 mm wafer carrier holds 25 wafers and weighs more than eight kilograms. Frequent manipulation of a payload of this size and weight may lead to repetitive strain injuries for operators in wafer fabrication facilities. Person-guided vehicles are being developed to assist operators in transporting and delivering these large carriers to their destinations. Person-guided vehicles, however, are heavy when loaded and can be difficult to manipulate, often requiring the operator to bend at the waist.

SUMMARY OF THE INVENTION

The invention provides a person-guided vehicle (PGV) for assisting an operator in the transportation and delivery of 300 mm wafer carriers to various destinations in the factory.

More particularly, the PGV comprises a cart comprising a frame, the frame having a load port side configured to align with the load port. The cart also includes wheels and at least one handle positioned to be grasped by an operator to push or pull the cart. A carrier support assembly is mounted to the frame. The carrier support assembly comprises a cradle configured to support the carrier, a lifting mechanism operative to raise and lower the cradle vertically, and a horizontal slide mechanism operative to move the cradle horizontally to and from a position outboard of the cart. A damping system is coupled to the cart and operative to dampen vibrations of the carrier in the carrier support assembly. The side of the cart opposite the load port side is left free of structural members to allow an operator to manipulate the cart to dock it at the load port using the large muscles of the leg and eliminating or minimizing bending at the waist.

The damping system comprises a damping device, such as a shock absorber, that may be coupled to the lifting mechanism, the cradle, or the legs of the cart. In another embodiment, the cart may include a subframe mounted within the frame and the damping system may comprise a damping device coupled between the subframe and the frame. The damping system also includes bumpers on the horizontal slide mechanism and on legs of the cart. The damping system also includes a suspension system coupled to the wheels of the cart.

The cradle comprises a pair of arms configured to support the carrier thereon. The lifting mechanism comprises a vertically oriented track, and the cradle is mounted for vertical travel along the track. The horizontal slide mechanism comprises a horizontally oriented track, and the lifting mechanism is mounted for horizontal travel along the track. The side of the cart opposite the load port side that is free of structural members allows operator access to the carrier support assembly.

The PGV also includes a docking mechanism configured to couple with a latch mechanism at the load port. The docking mechanism may comprise a hook mechanism configured to hook to a latch pin at the load port. A handle is coupled to the hook mechanism to actuate the hook mechanism. The hook mechanism may be retractable within the periphery of the cart.

The PGV can be configured to include a plurality of carrier support assemblies, either horizontally or vertically. Preferably, two carrier support assemblies are provided.

DESCRIPTION OF THE DRAWINGS

The invention will be more fully understood from the following detailed description taken in conjunction with the accompanying drawings in which.

DETAILED DESCRIPTION OF THE INVENTION

Figure 1:
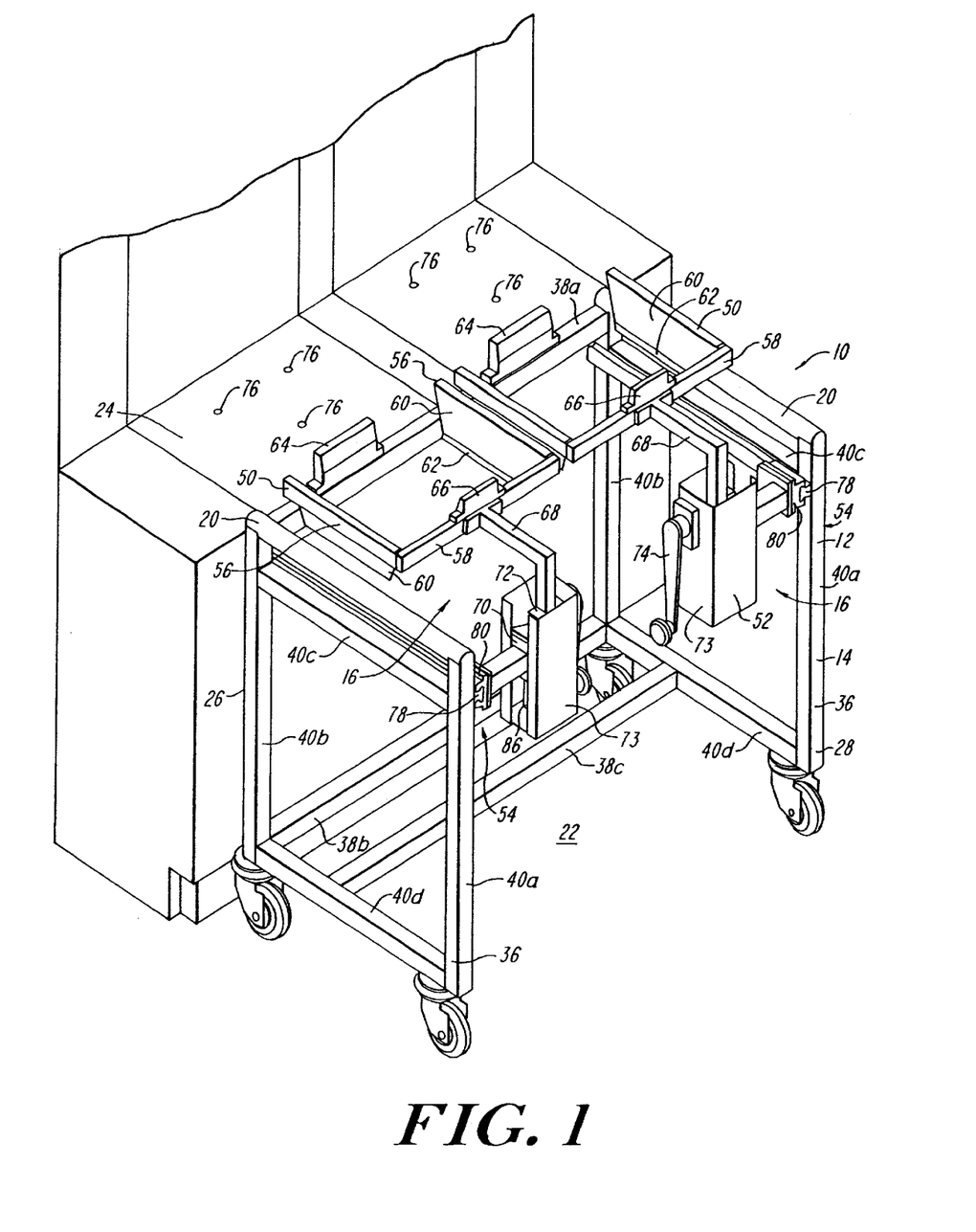
FIG. 1 is an isometric view of a first embodiment of a person-guided vehicle (PGV) according to the present invention.
Figure 2:
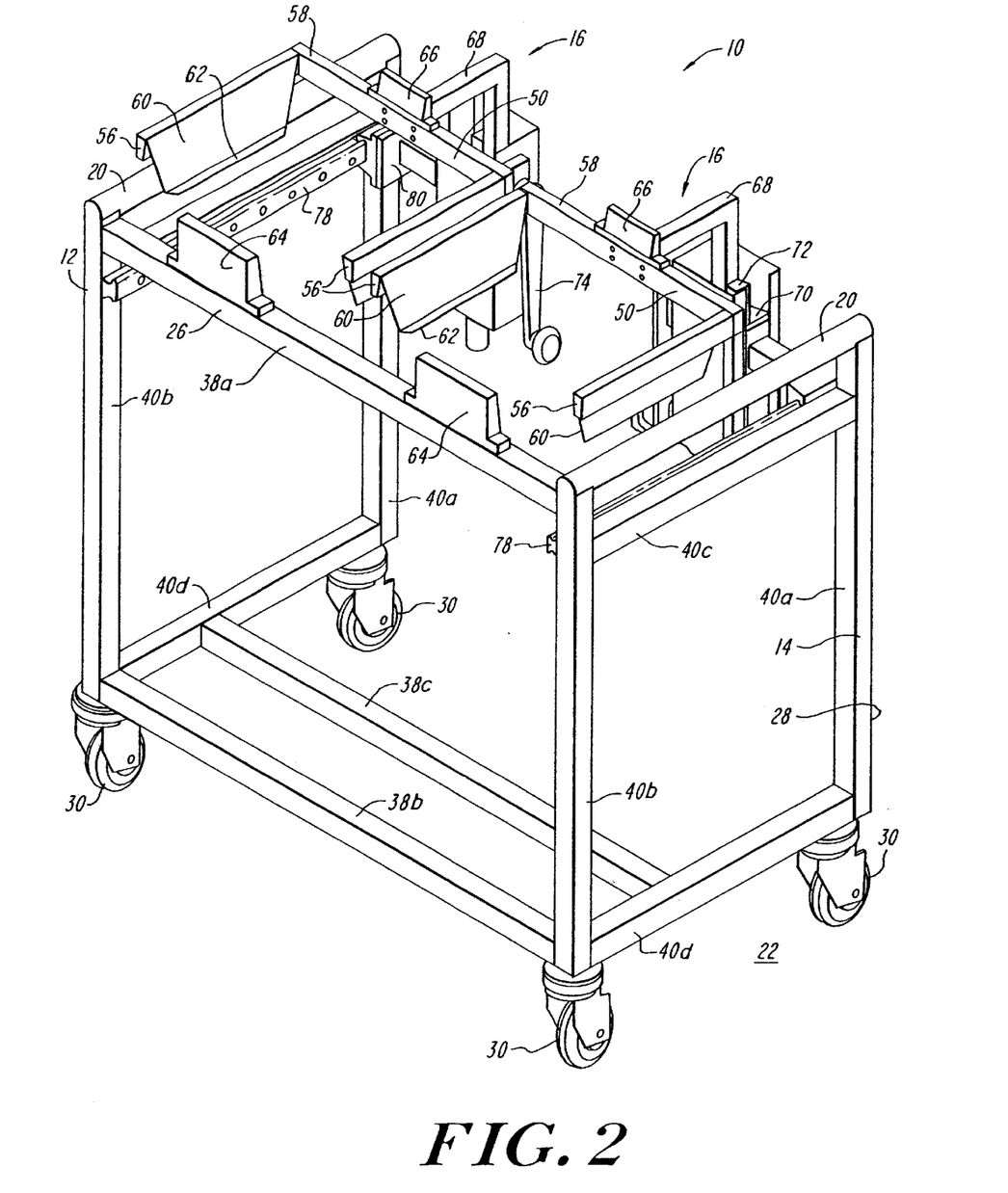
FIG. 2 is a further isometric view of the PGV of FIG. 1.
Figure 3:
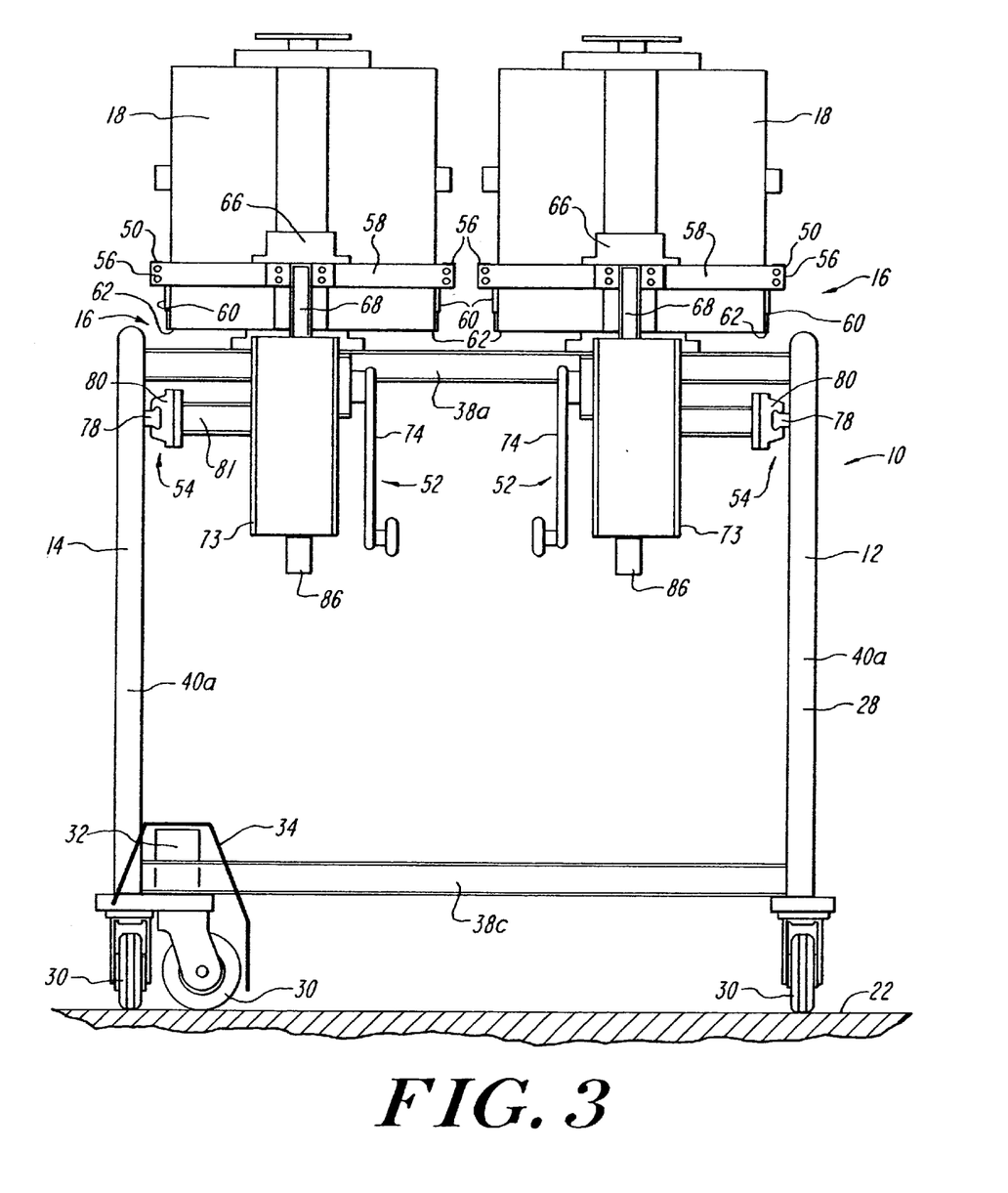
FIG. 3 is a side view of the PGV of FIG. 1.
Figure 4:
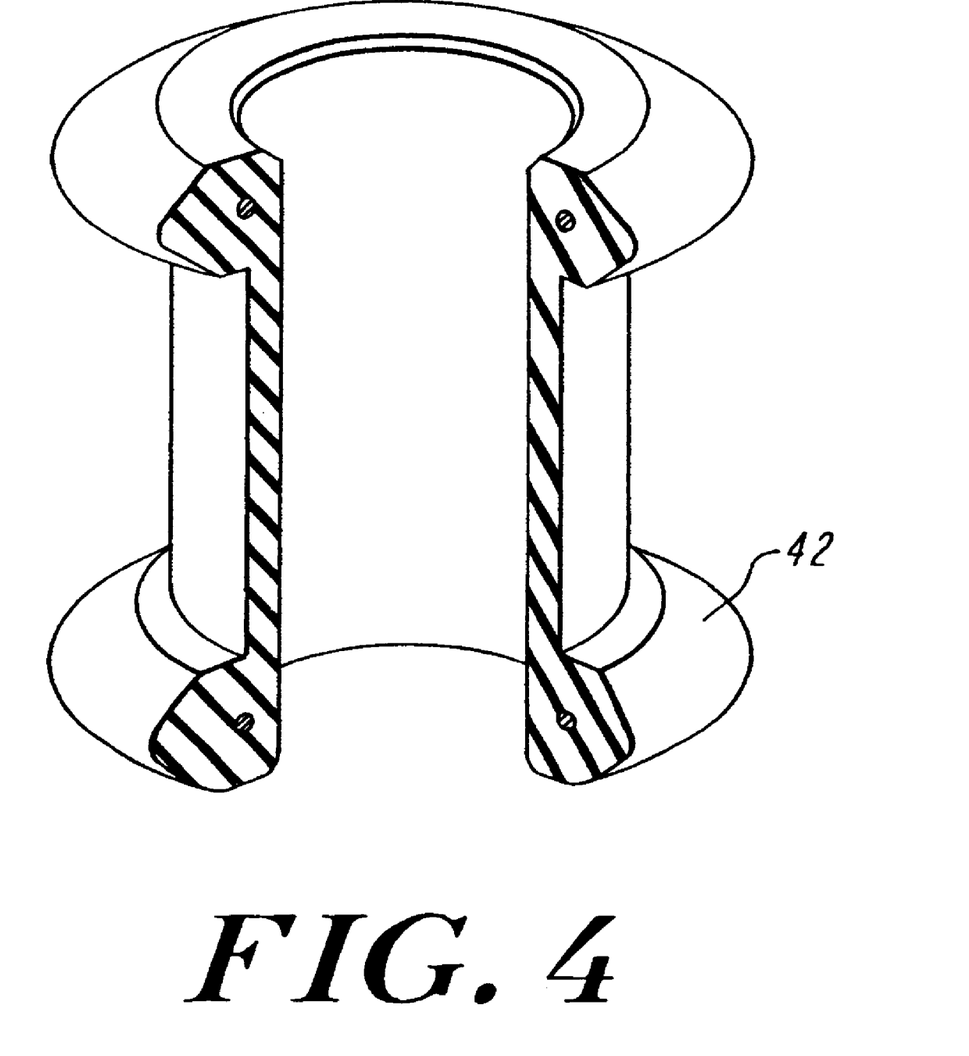
FIG. 4 is a partially cut away view of a corner bumper for use with a PGV according to the present invention.

A first embodiment of a person-guided vehicle (PGV) 10 according to the present invention is shown in FIGS. 1–3. The PGV comprises a cart 12 having a generally box-like frame 14 for supporting at least one and preferably two carrier support assemblies 16 that each holds one carrier 18. Handles 20 are provided along each end of the cart at a height to allow an operator to readily push the cart along a floor 22. The cart is docked with its sides parallel to a load port 24. The carrier support assemblies 16 are oriented so that the access faces of the carriers 18 face the load port 24. The carriers are loaded and unloaded from one side of the cart, the load port side 26. The opposite side 28 of the cart 12 is left open or free of structural members so that the operator can dock the cart using the large muscles of the legs, eliminating or minimizing bending at the waist. Also, the operator can access the carrier support assemblies from the open side.

The cart 12 is wheeled so that an operator can push the cart along the floor. Castor type wheels 30 are used to allow steering and docking. At least two of the wheels, preferably the wheels on the open side 28 of the cart, include brakes. Any suitable brakes, as known in the art, may be used. Preferably, the cart also includes a suspension system, such as a shock absorber 32 at each wheel, illustrated in FIGS. 3, 5–7, and 9–12. Each wheel and associated suspension may be covered with a shroud 34 (one shown in FIG. 3) to contain particles.

Figure 14:
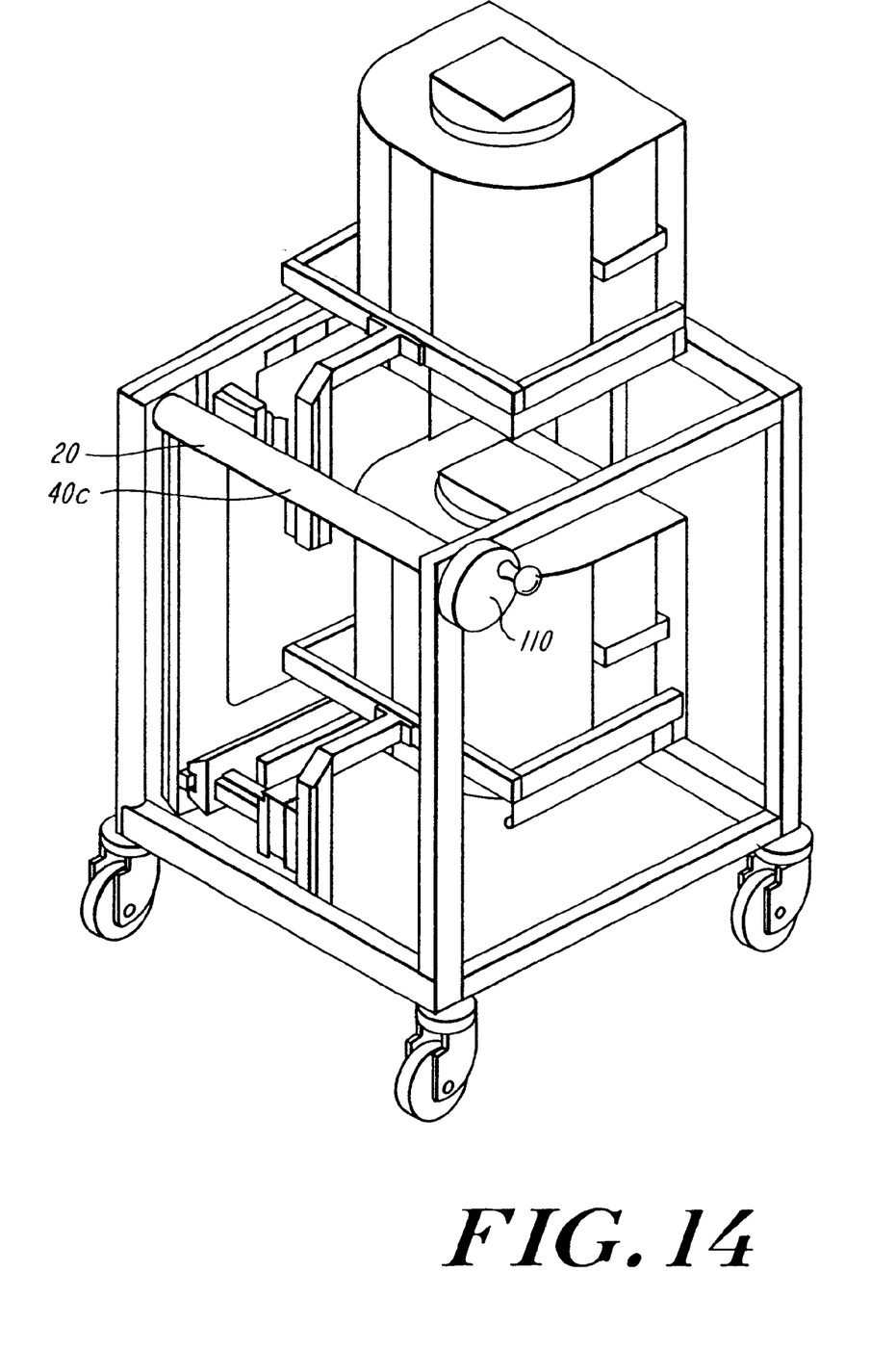
FIG. 14 is an isometric view of a further embodiment of a PGV according to the present invention.

In the embodiment shown, the frame 14 comprises two end frames 36 joined by a plurality of horizontal connecting members 38a, 38b, 38c. Each end frame 36 comprises two vertical members or legs 40a, 40b, a horizontal cross member 40c near the top, and a horizontal cross member 40d near the bottom. The handles 20 may serve as the structural horizontal cross members of each end frame if desired, as illustrated in the embodiment of FIG. 14. It will be appreciated that other handle configurations are possible, such as handlebars that protrude outwardly from the end frames. The horizontal connecting members include at least one connecting member 38a joining the tops of the end frames 36 along the load port side 26 and at least one connecting member 38b joining the bottoms of the end frames 36 along the load port side 26. A third horizontal cross member 38c is provided connecting the bottom of the end frames 36 and offset inwardly from the load port side 26. The open side 28 is left free of horizontal connecting members to allow operator access to the carrier support assemblies 16 within the frame 14. Other structural members, such as diagonal corner bracing, may be provided if desired, as would be known in the art. See FIG. 8. The frame 14 may be made of any suitable material, such as stainless steel. The frame members may be square, rectangular, or circular in cross-section or may have any other desired cross-section. To protect the contents of the carriers during travel, corner bumpers 42 formed of any suitable highly damped elastomeric material are preferably provided on the legs to dampen vibrations from any impacts. See FIGS. 4 and 9–12.

The carrier support assembly 16 includes a cradle 50 on which a carrier 18 rests, a vertical lifting mechanism 52, and a horizontal slide mechanism 54. In the embodiment shown, the cradle includes a forked structure having a pair of parallel arms 56 connected by a cross bar 58. A flange 60 depends from each arm. A lip 62 is provided along the bottom edge of each flange. The carrier 18 rests on the lips 62. The flanges 60 serve as restraining walls to prevent sideways movement of the carrier. An upstanding guard 64 is provided on the upper horizontal connecting member 38a of the frame 14. Another guard 66 is provided on the cross bar 58 of the cradle 50. The guards 64, 66 and flanges 60 ensure that, when a carrier is mounted on the cradle within the cart, the carrier is restrained in all directions.

Figure 5:
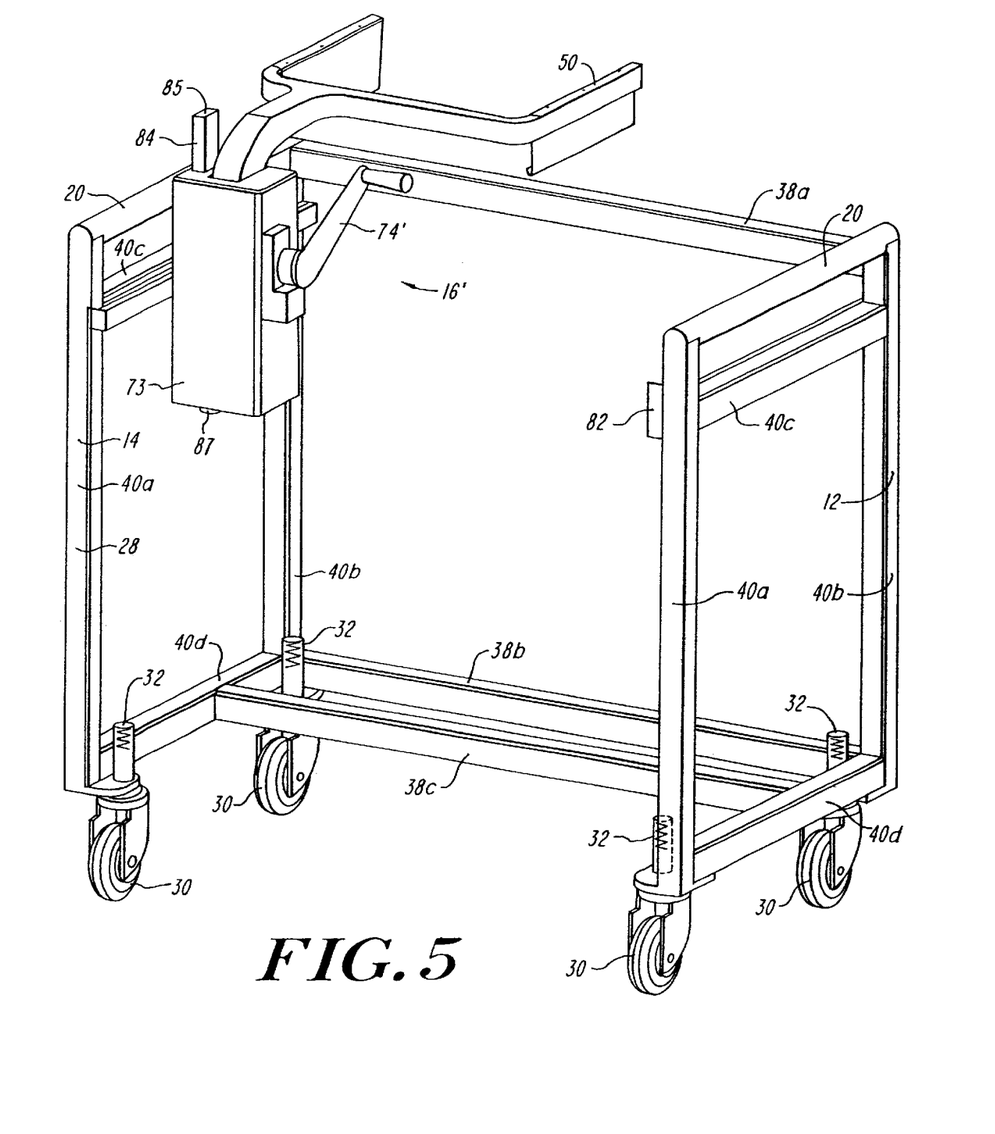
FIG. 5 is an isometric view of a further embodiment of a PGV according to the present invention.
Figure 6:
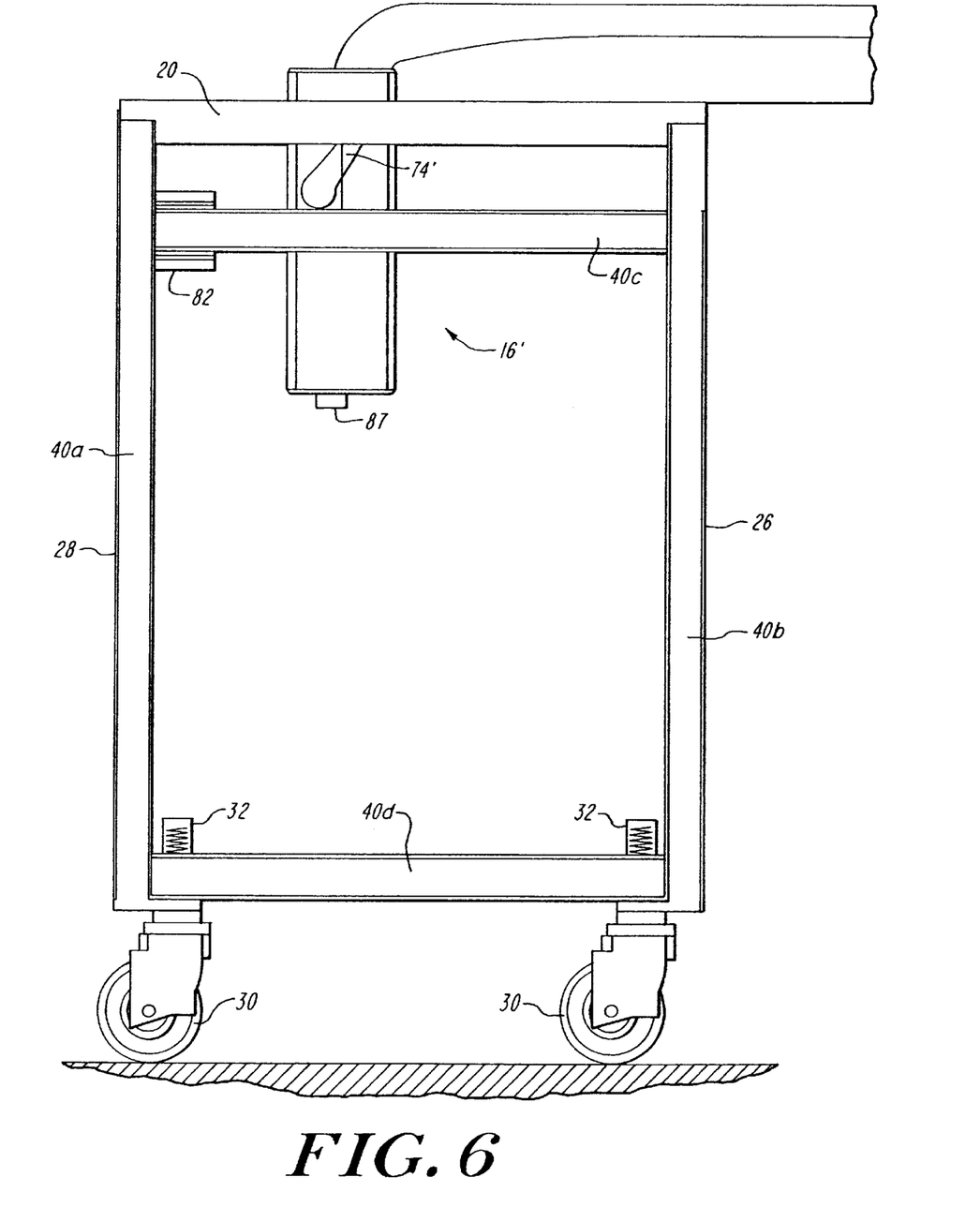
FIG. 6 is an end view of the PGV of FIG. 5.
Figure 7:
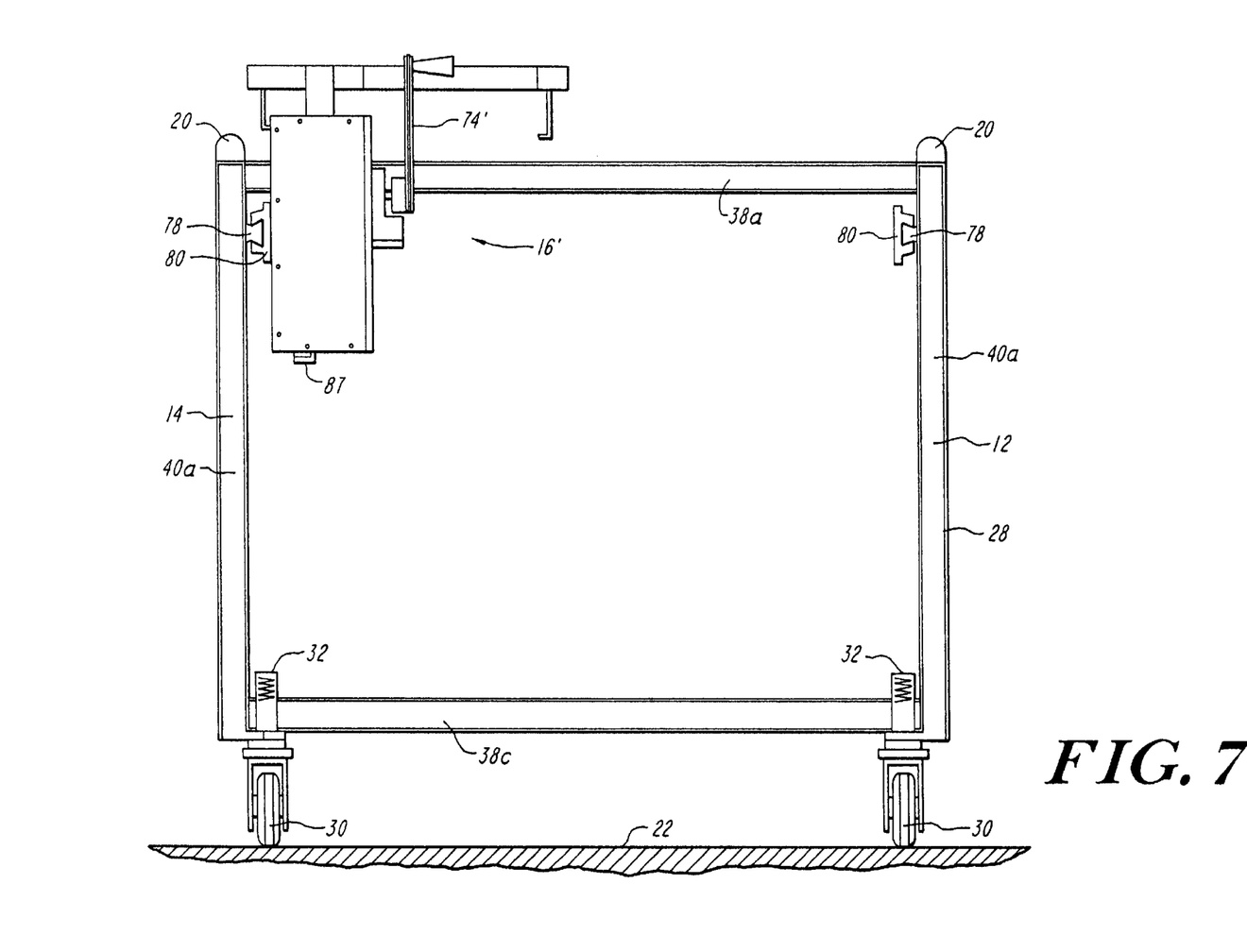
FIG. 7 is a side view of the PGV of FIG. 5.

The cradle is mounted via an arm 68 with a right angle bend to the lifting mechanism 52, which is operative to move the cradle 50 vertically. The right-angle arm 68 is mounted on a bracket 70 that slides along a vertical track 72 disposed in a housing 73. The lifting mechanism 52 includes a handle 74 accessible by the operator from the open side 28 of the cart. In the embodiment of FIGS. 1–3, when the handle is down, the cradle is at its lowest point of vertical travel. To raise the cradle, the handle is rotated about 180° to an over center position. In the embodiment of FIGS. 5–7, the handle 74' is rotatable over 90° from a position facing the operator to a position facing the load port, illustrated in FIGS. 5–7. The handle 74' is preferred, because the operator does not have to bend to rotate the handle.

Rotation of the handle may be converted to linear motion by any suitable rotary-to-linear conversion mechanism, as known in the art. For example, handle 74' may be attached to an eccentric cam. Rotation of the cam lifts a cam follower on the cradle along the vertical axis. The cam can be shaped to accelerate the payload smoothly. At the top of the lifting, the cam follower falls into a small detent on the cam. The weight of the handle 74' is in an over-center position, which helps to retain the cradle in the raised position. To lower the cradle, the handle 74' is pulled toward the operator, which moves the cam follower out of the detent. A damper 86 is provided in the housing 73 to control the downward acceleration of the cradle independently of how hard the operator pulls back on the handle. An adjustable end stop 87 may be provided at the bottom of the housing.

The lifting mechanism 62 lifts the cradle 50 sufficiently vertically, approximately 1.5 to 2 inches, to ensure that the carrier 18 clears the frame guard 64 and any coupling mechanism, such as coupling pins 76, at the load port 24 during horizontal travel. When the carrier 18 is positioned vertically above the load port coupling pins 76, the lifting mechanism 52 is operative by rotation of the handle 74 downwardly to lower the carrier onto the pins. The carrier 18 is retained on the pins 76 while the lifting mechanism 52 continues to lower the cradle 50. In this manner, the carrier 18 is decoupled from the cradle 50, and the carrier support assembly 16 can be withdrawn from the load port 24 back into the cart 12.

The horizontal slide mechanism 54 of the carrier support assembly 16 moves the cradle 50 horizontally over the load port 24. The horizontal slide mechanism preferably comprises a slide bar 78 or track mounted to the cross member 40c of the end frame 36. A bracket 80 attached to the lifting mechanism 52 fits over the slide bar 78. The bracket 80 may be attached to the lifting mechanism 52 via an extending arm 81 to center the lifting mechanism on the cross bar 58 of the cradle 50. Alternatively, the bracket may be attached to the lifting mechanism directly (see FIGS. 5 and 7), in which case the lifting mechanism is offset from the center of the cross bar of the cradle. The cradle 50 or lifting mechanism 52 is pushed manually by the operator along the slide bar 78 to a position over the load port 24 or pulled by the operator back into the cart. Bumpers 82 are provided on the ends of each slide bar 78 for decelerating the carrier 18, for clarity illustrated only in FIGS. 5 and 6 and schematically in FIGS. 9–12. The bumpers 82 are made of any suitable highly damped elastomeric material. A handle 84 may be provided on the carrier support assembly 16 in a location that the operator can readily grasp, for example, on the lifting mechanism housing, to assist the pushing and pulling actions. See FIG. 5. The slide mechanism may be made of any suitable material, such as stainless steel. A cover (not shown) may be provided over the slide mechanism to contain particles.

For clarity, only one carrier support assembly 16 and handle 84 are shown in FIG. 5. It will be appreciated, however, that another handle 84 is provided on a second carrier support assembly on the cart. When standing adjacent the open side of the cart, the operator can grasp both handles 84 to manipulate the cart adjacent the load port for docking thereto. With this configuration, the operator can use the large muscles of the legs while minimizing or eliminating bending at the waist.

The horizontal slide mechanism 54 includes a lock to retain the cradle within the cart during travel to a destination. For example, in one embodiment, detents are provided on each end of the slide bar 78. A spring-loaded cam is provided on the bottom of the handle 84 that is biassed to fit into the detents at the ends of the slide bar. A push button 85 on top of the handle 84, operable by the operator's thumb, is connected to the cam to cause the cam to disengage from the detent when the button is pushed. Thus, to move the cradle horizontally, the operator grasps the handle 84, pushes the button 85 to unlock the cradle, and pushes or pulls the cradle in the desired direction. To relock the cradle, the operator lifts the thumb off the button, causing the cam to spring into the detent when it reaches that position.

The PGV includes a damping system to prevent excessive vibrations from affecting the items, such as semiconductor wafers, in the carrier during travel. In the presently preferred embodiment, a damping mechanism is provided in the lifting mechanism 52 by a hydraulic shock absorber 86 or other suitable damping device located in the bottom of the housing 73. The cradle 50 rests on the shock absorber 86 at its lowest point of vertical travel. The damping mechanism prevents vibrations from damaging the wafers in the carrier as the PGV is transported over the floor, which may include small bumps. The vibration limit is preferably 0.1 G rms, 0.25 G maximum, when passing over a step that is 1/8 inch high. Any suitable damping device may be used, such as Enidine model OEM 1.25 m×2 or Fuji Seiki model FA-3650 shock absorbers. The suspensions 32 at the cart wheels, the bumpers 42 on the frame legs, and the bumpers 82 on the horizontal slide mechanism also form part of the damping system to protect the items in the carriers from damage.

Figure 8:
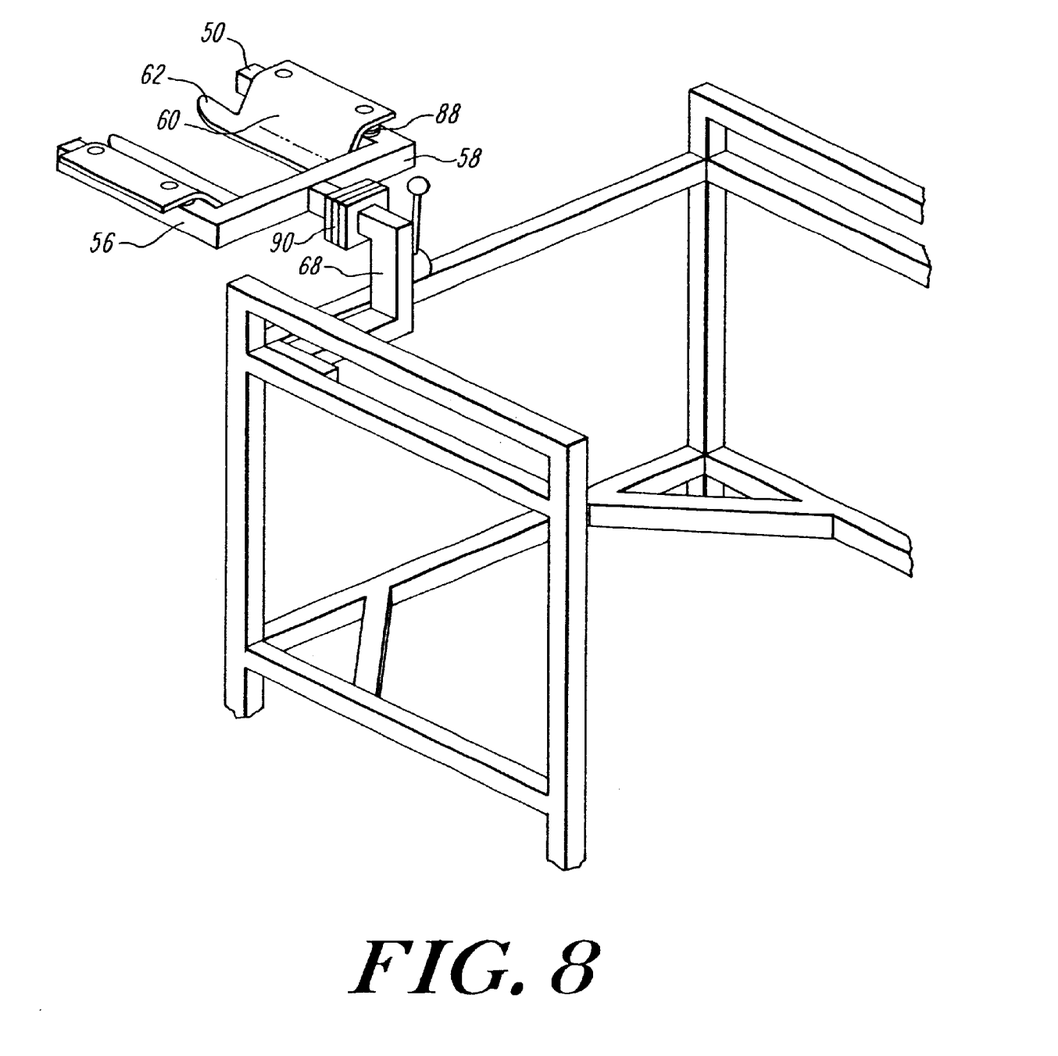
FIG. 8 is a partial isometric view of a further embodiment of a PGV according to the present invention.
Figure 9:
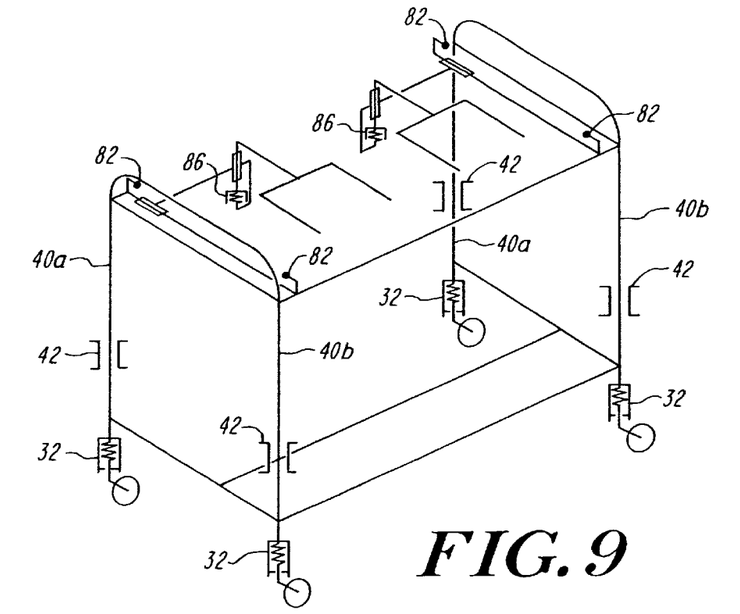
FIG. 9 is a schematic view of a damping system for a PGV according to the present invention.
Figure 10:
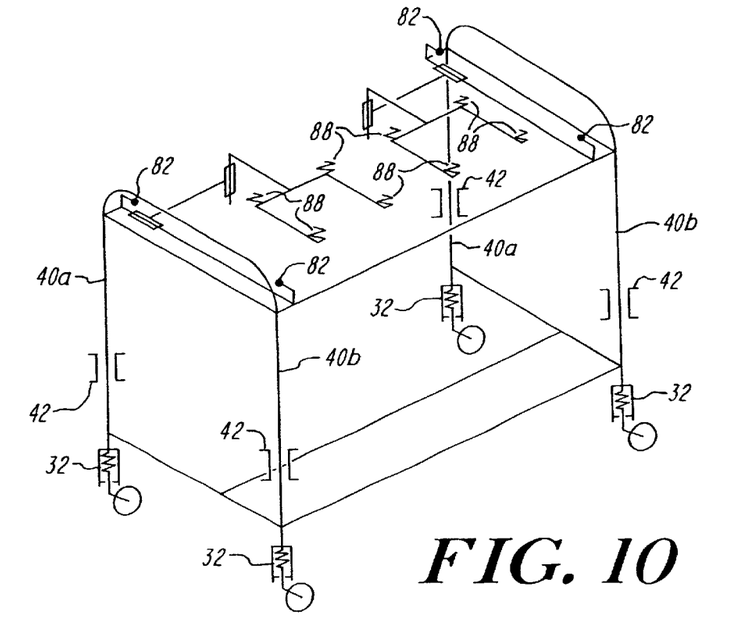
FIG. 10 is a schematic view of a further damping system for a PGV according to the present invention.

In a further embodiment, illustrated in FIGS. 8 and 10, the cradle 50 may include a damping mechanism, such as shock absorbers 88 mounted between the arms 56 of the cradle and the flanges 60. The damping mechanism may be provided as an alternative or in addition to the damping mechanism in the lifting mechanism. Alternatively, also illustrated in FIG. 8, a damping mechanism 90 may be provided in the arm supporting the cradle on the lifting mechanism.

Figure 11:
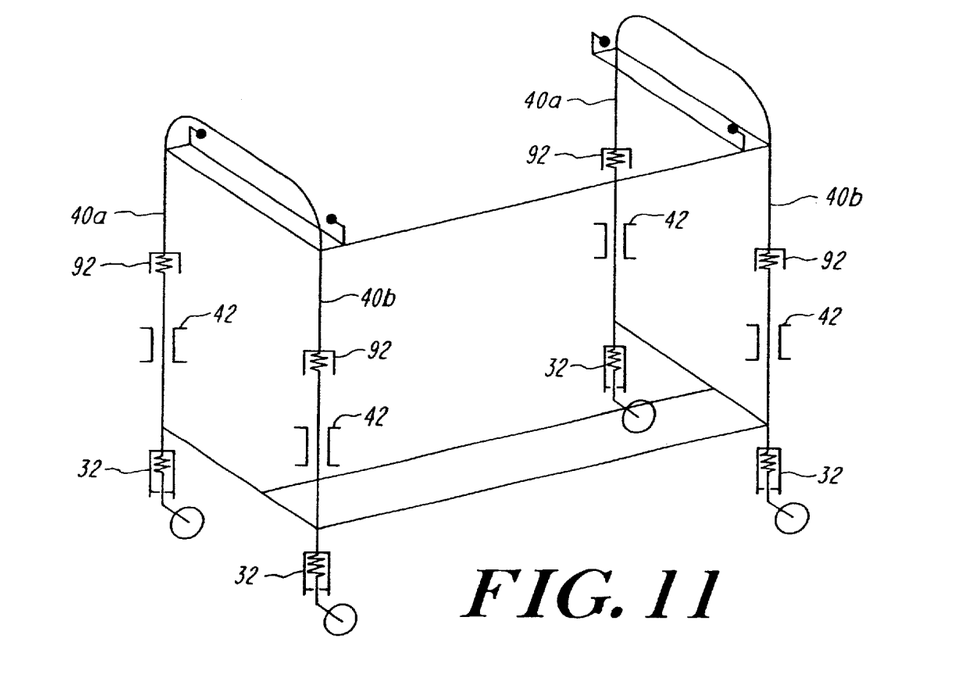
FIG. 11 is a schematic view of a still further damping system for a PGV according to the present invention.
Figure 12:
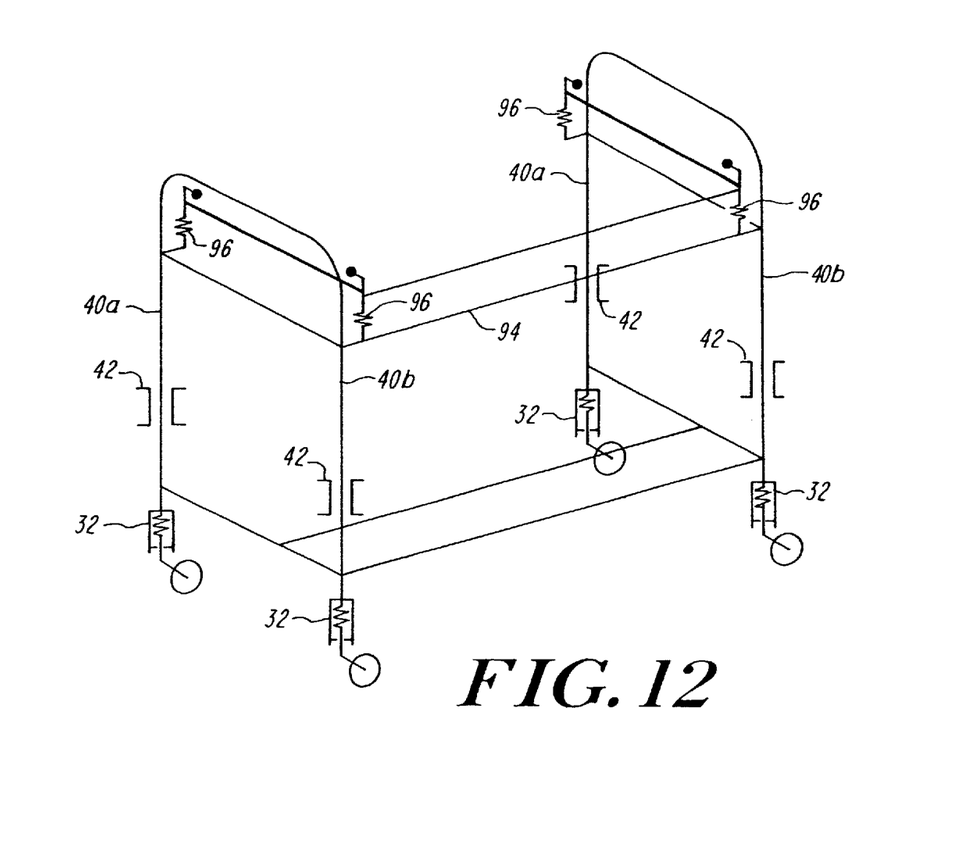
FIG. 12 is a schematic view of a still further damping system for a PGV according to the present invention.

In a still further embodiment, illustrated schematically in FIG. 11, the legs 40a, 40b may include a damping mechanism 92 formed therein, either as an alternative or in addition to the damping mechanism in the lifting mechanism. For example, shock absorbers may be provided in the legs. In a still further embodiment, illustrated schematically in FIG. 12, a subframe 94 may be provided mounted to the legs of the frame. The subframe may include a damping mechanism, such as shock absorbers 96 at each corner.

Figure 13:
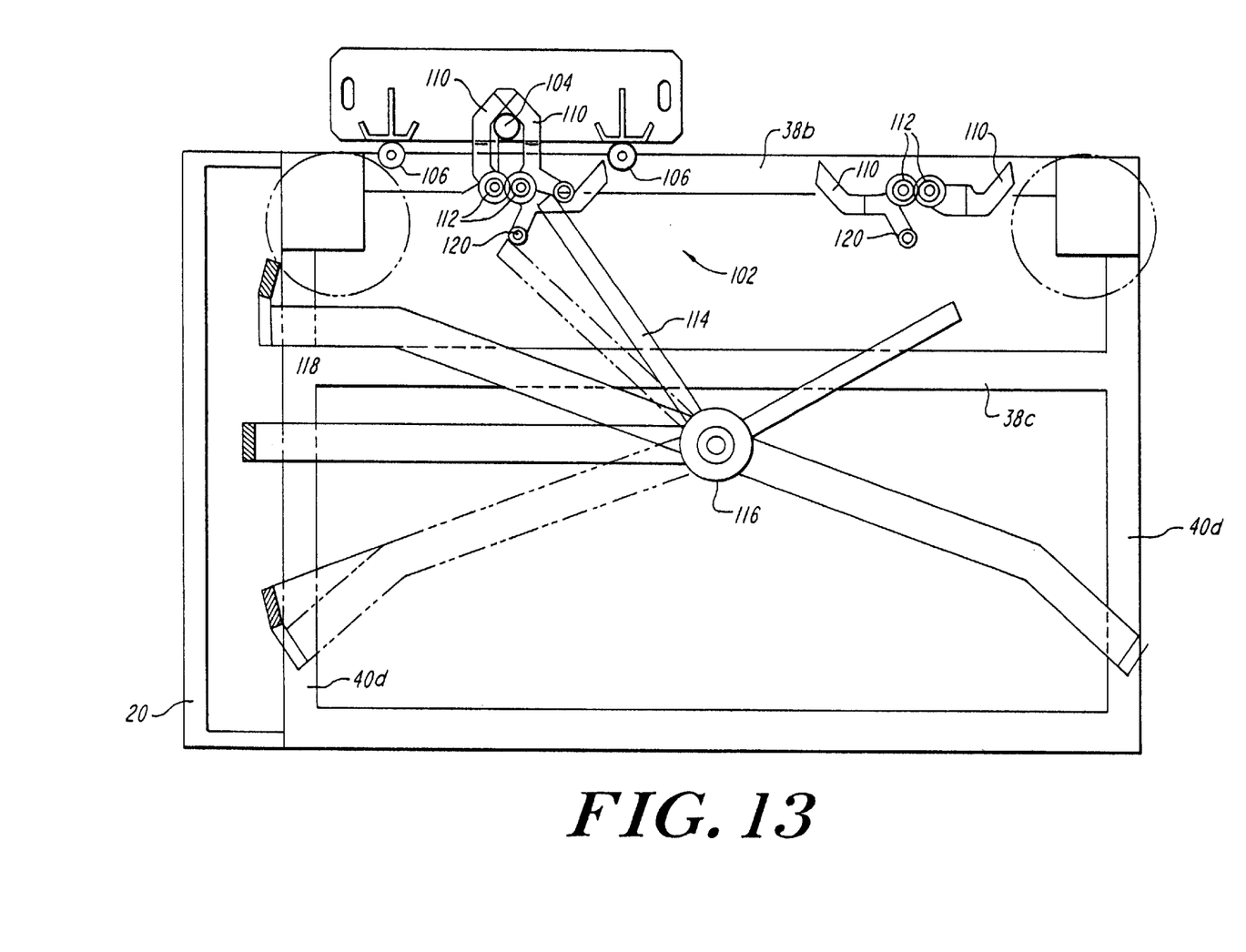
FIG. 13 is a plan view of a docking mechanism for a PGV according to the present invention.

The PGV also includes a load port docking mechanism 102 that aligns the cart with the load port and attaches the cart to a latch pin 104 provided in the floor in a recess in the load port wall, illustrated in FIG. 13. The docking mechanism includes a pair of guide or centering wheels 106 that direct the cart into engagement with the recess. The docking mechanism also includes a latching mechanism operative to latch onto the latch pin. In one embodiment, the latching mechanism has a pair of rotatable hooks 110 connected by meshing gears 112 such that rotation of one hook causes rotation in the opposite direction of the other hook. The hooks are operable by an arm 114 that is rotatable about a central hub 116 mounted to the cart frame, for example, by a bracket mounted to the connecting member. A handle 118 engageable by the operator is also fixed for rotation to the central hub 116. Thus, rotation of the handle causes rotation of the arm, which pushes on a protrusion 120 on one of the hooks, causing the hooks to close around the latch pin 104. In this manner, the cart may be locked to the load port. The latching mechanism may be released by, for example, pulling on the cart to cause the hooks to open or by moving the handle in the opposite direction. The hooks may be spring-loaded to return to an open position within the cart, so that they do not protrude and become a trip hazard during transport. It will be appreciated that other latching mechanisms can be used. In the embodiment illustrated in FIG. 13, two docking mechanisms are provided. The docking mechanisms may be operable together or independently. In the semiconductor manufacturing field, the coupling pins at the load port are designed to compensate for offsets of the carrier of up to 1/4 inch, so no further compensation for operator misalignment with the coupling pins is typically needed beyond docking the cart at the load port.

The PGV must be able to maintain its stability when one or both carrier support assemblies are extended beyond the side of the cart. Toward this end, a balancing mechanism may be provided, such as a counterweight plate attached to the frame at the open side and/or counterweights inserted inside vertical frame members that are hollow.

In operation, an operator unlocks the wheels if locked and pushes the cart along until reaching the desired destination. The operator aligns the load port side of the cart parallel to the load port wall. Then, the operator moves to the open side of the cart and grasps the handles 84. Using the handles 84, the operator manipulates the cart to engage the docking mechanism to hold the cart at the load port. To load a carrier onto the load port, the operator raises the carrier on the cart using the lifting mechanism handle. Then, the operator releases the slide lock on the horizontal slide mechanism and pushes the cradle toward the load port to a stop. The operator turns the lifting mechanism handle down to lower the carrier on to the load port coupling pins. Further lowering of the handle lowers the cradle to disengage it from the carrier. The cradle is retracted by pulling it away from the load port. The operator then undocks the cart and moves the cart to the next destination.

To retrieve a carrier, the operator docks the cart at the desired load port and verifies that the cradle is in the lower position. The operator unlocks the horizontal slide lock and pushes the cradle all the way under the carrier. Then, by lifting the lifting mechanism handle, the carrier is lifted off the load port. The operator pulls the cradle back into the cart until the slide is locked. The handle is lowered, thereby lowering the carrier onto the damping mechanism. The operator then unlocks the docking mechanism and moves the cart to the next destination.

Other embodiments of a PGV encompassing aspects of the present invention are contemplated. For example, a cart having vertically stacked carrier support assemblies, illustrated in FIG. 14, may be provided. A crank 110 or other mechanism may be provided to raise the lower carrier support assembly into a position from where it can be moved over the load port. The invention is not to be limited by what has been particularly shown and described, except as indicated by the appended claims.

What is claimed is:

1. A person-guided vehicle for transporting and manipulating at least one carrier containing items to be loaded or unloaded at a load port, the person-guided vehicle comprising:

a cart comprising a cart frame, the cart frame comprising:
two end frames each including a plurality of structural members disposed to define a cart end,
a load port side frame including at least one structural member connecting the two end frames to define a load port side,
the two end frames and the load port side frame defining an interior region of the cart frame,
a plane extending between edges of the cart ends opposite the load part side to define a side opposite the load port side, wheels on the cart frame, and
at least one handle on the cart frame to be grasped by an operator to push or pull the cart;
a carrier support assembly mounted to the cart frame, the carrier support assembly comprising:
a cradle configured to support the carrier,
a lifting mechanism operative to raise and lower the cradle vertically, and
a horizontal slide mechanism operative to move the cradle horizontally to and from a position outboard of the cart frame; and
the side opposite the load port side is free of structural members connecting the two end frames to allow operator access through the side opposite the load port side to the interior region of the cart frame.

2. The person-guided vehicle of claim 1, further comprising a damping system coupled to the lifting mechanism of the cart and operative to dampen vibrations of the carrier in the carrier support assembly.

3. The person-guided vehicle of claim 1, wherein the cradle comprises a pair of arms configured to support the carrier thereon, and the arms are mounted to the lifting mechanism.

4. The person-guided vehicle of claim 3, wherein the cradle further includes a flange depending from each arm, and inwardly directed, opposed lips on the flanges configured to support the carrier.

5. The person-guided vehicle of claim 1, wherein the lifting mechanism comprises a vertically oriented track, and the cradle is mounted on a bracket for vertical travel along the track.

6. The person-guided vehicle of claim 5, wherein the lifting mechanism further includes a handle rotatable by an operator and a rotary-to-linear conversion mechanism configured to convert rotation of the handle to linear motion of the bracket along the track.

7. The person-guided vehicle of claim 1, wherein the lifting mechanism is supported by the horizontal slide mechanism.

8. The person-guided vehicle of claim 1, wherein the horizontal slide mechanism comprises a horizontally oriented track, and the lifting mechanism is mounted on a bracket for horizontal travel along the track.

9. The person-guided vehicle of claim 1, wherein the carrier support assembly is pushably and pullably mounted to the horizontal slide mechanism.

10. The person-guided vehicle of claim 1, wherein the horizontal slide mechanism includes a lock to retain the carrier support assembly within a periphery of the frame.

11. The person-guided vehicle of claim 1, wherein the cart further includes a guard mounted on the cart frame to restrain the carrier within a periphery of the cart frame.

12. The person-guided vehicle of claim 1, wherein the cart includes a docking mechanism mounted to the cart frame, the docking mechanism comprising a hook mechanism configured to hook to a latch pin at the load port and a handle coupled to the hook mechanism to actuate the hook mechanism.

13. The person-guided vehicle of claim 12, wherein the hook mechanism is retractable within a periphery of the cart.

14. The person-guided vehicle of claim 1, wherein the handle is located on an end of the cart orthogonal to the load port side.

15. The person-guided vehicle of claim 1, further comprising a second carrier support assembly mounted to the cart frame.

16. The person-guided vehicle of claim 15, wherein the second carrier support assembly is located horizontally adjacent to the carrier support assembly.

17. The person-guided vehicle of claim 15, wherein the second carrier support assembly is located vertically adjacent to the carrier support assembly.

* * * * *

UNITED STATES PATENT AND TRADEMARK OFFICE
Certificate

Patent No. 6,454,512 B1　　　　　　　　　　　　　　　　　Patented: September 24, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Mitchell Weiss, Carlisle, MA; and Zvi Alon, Haifa, Israel.

Signed and Sealed this Twenty-third Day of September 2003.

EILEEN D. LILLIS
*Acting Supervisory Patent Examiner*
Art Unit 3652